US007230846B2

United States Patent
Keshavarzi et al.

(10) Patent No.: US 7,230,846 B2
(45) Date of Patent: Jun. 12, 2007

(54) PURGE-BASED FLOATING BODY MEMORY

(75) Inventors: Ali Keshavarzi, Portland, OR (US); Stephen H Tang, Pleasanton, CA (US); Dinesh Somasekhar, Portland, OR (US); Fabrice Paillet, Hillsboro, OR (US); Muhammad M Khellah, Tigard, OR (US); Yibin Ye, Portland, OR (US); Vivek K De, Beaverton, OR (US); Gerhard Schrom, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 11/151,982

(22) Filed: Jun. 14, 2005

(65) Prior Publication Data

US 2006/0279985 A1    Dec. 14, 2006

(51) Int. Cl.
*G11C 11/34* (2006.01)
(52) U.S. Cl. ...................... 365/177; 365/149
(58) Field of Classification Search ................ 365/177
See application file for complete search history.

(56) References Cited

U.S. PATENT DOCUMENTS 6,621,725 B2    9/2003  Ohsawa
6,714,436 B1 *  3/2004  Burnett et al. ............... 365/149
6,873,539 B1 *  3/2005  Fazan et al. ................. 365/149
7,002,842 B2 *  2/2006  Tang et al. ................... 365/177

OTHER PUBLICATIONS

Ohsawa, Takashi , "Memory Design Using a One-Transistor Gain Cell on SOI", *IEEE Journal of Solid-State Circuits*, vol. 37, No. 11, (Nov. 2002), 1510-1522.
Yoshida, Eiji, "A Design of a Capacitorless 1T-DRAM Cell Using Gate-induced Drain Leakage (GIDL) Current for Low-power and High-speed Embedded Memory", *Fujitsu Laboratories Ltd.*, 4 pages (2003).

* cited by examiner

*Primary Examiner*—Tan T. Nguyen
(74) *Attorney, Agent, or Firm*—Douglass J. Ryder; Ryder IP Law, PC

(57) ABSTRACT

In general, in one aspect, the disclosure describes a memory array including a plurality of memory cells arranged in rows and columns. Each memory cell includes a transistor having a floating body capable of storing a charge. A plurality of word lines and purge lines are interconnected to rows of memory cells. A plurality of bit lines are interconnected to columns of memory cells. Driving signals provided via the word lines, the purge lines, and the bit lines can cooperate to alter the charge of the floating body region in one or more of the memory cells.

21 Claims, 12 Drawing Sheets

|         | 550 WL | 560 PL | 570 BL |
|---------|--------|--------|--------|
| 510 PURGE 0 | 0 | − | 0 |
| 520 HOLD    | 0 | 0 | 0 |
| 530 WRITE 1 | − | 0 | + |
| 540 KEEP 0  | − | 0 | 0 |

FIG. 5A

|  | WL | SWL | PL | BL |
|---|---|---|---|---|
| WRITE "1" | HIGH | HIGH | HIGH | LOW (0) |
| HOLD | LOW (0) | (-) | LOW (0) | LOW (0) |
| WRITE "0" | (-) | HIGH | LOW (0) | (-) |
| KEEP "1" | (-) | HIGH | LOW(0) | LOW(0) |

*FIG. 8A*

PURGE-BASED FLOATING BODY MEMORY

BACKGROUND

Modern microprocessors integrate on-chip (on-die) cache memory as an efficient means of achieving high performance memory access. On-chip cache provides high-speed, temporary data storage that the microprocessor can access more quickly than off-chip memory. The trend in microprocessor performance improvement is to incorporate ever more cache memory and to configure the cache in multiple (hierarchical) levels (e.g., L1 and L2).

Traditionally, on-chip cache memory has been implemented using Static Random Access Memory (SRAM) because SRAM has very high access speed and low latency. But because each bit of SRAM typically requires six transistors (6T), the size of on chip caches have been limited in order to maintain reasonable die size and manufacturing cost.

One alternative to SRAM is Dynamic Random Access Memory (DRAM). DRAM has a simpler cell structure than SRAM, but requires regular access (refresh) to maintain the data in each storage cell. One common type of DRAM is a 1T-1C DRAM that uses a cell made from one transistor (e.g., a Metal-Oxide-Semiconductor Field Effect Transistor (MOSFET)) and one capacitor. The capacitor is used to store a data bit in the form of an electronic charge, and the transistor provides read and write access to the charge held in the capacitor. The transistor is often referred to as the "access" transistor or the "transfer device" of the DRAM cell. This cell is typically about one-tenth the size of a 6T SRAM cell. However, this type of DRAM may require special processing steps to make capacitors that can store enough charge to maintain reasonable refresh times (e.g., at least 25 fF). The special processing steps are not typically used in the fabrication of microprocessors. The capacitor may also limit the scalability of the traditional DRAM structure.

BRIEF DESCRIPTION OF THE DRAWINGS

The features and advantages of the various embodiments will become apparent from the following detailed description in which:

FIG. 5A illustrates a table of example drive levels for a purge-based floating body memory array, according to one embodiment

FIG. 8A illustrates a table of example drive levels for a two transistor purge-based floating body memory array, according to one embodiment;

DETAILED DESCRIPTION

A smaller memory cell that is also compatible with the traditional microprocessor fabrication process would enable the implementation of larger on-chip caches and, hence, higher performance microprocessors. A floating body DRAM (FBDRAM) cell eliminates the capacitor and stores charge in the body of the cell's active device (e.g., MOSFET) and thus provides a small memory cell that is compatible with standard microprocessor fabrication processes. Implementation of a FBDRAM requires at least one active device in each cell with gain (called a "gain cell"). Floating-body gain cells can be fabricated using a standard CMOS process (the process typically used to fabricate standard microprocessors) with little or no modification. Accordingly, floating-body gain cells are less expensive to manufacture and more scalable to future device technologies than the traditional 1T-1C DRAM cell. The FBDRAM may be implemented using Silicon-on-Insulator (SOI) technology or in bulk silicon technology using either floating n-wells or shallow-well technology.

Figure 1:
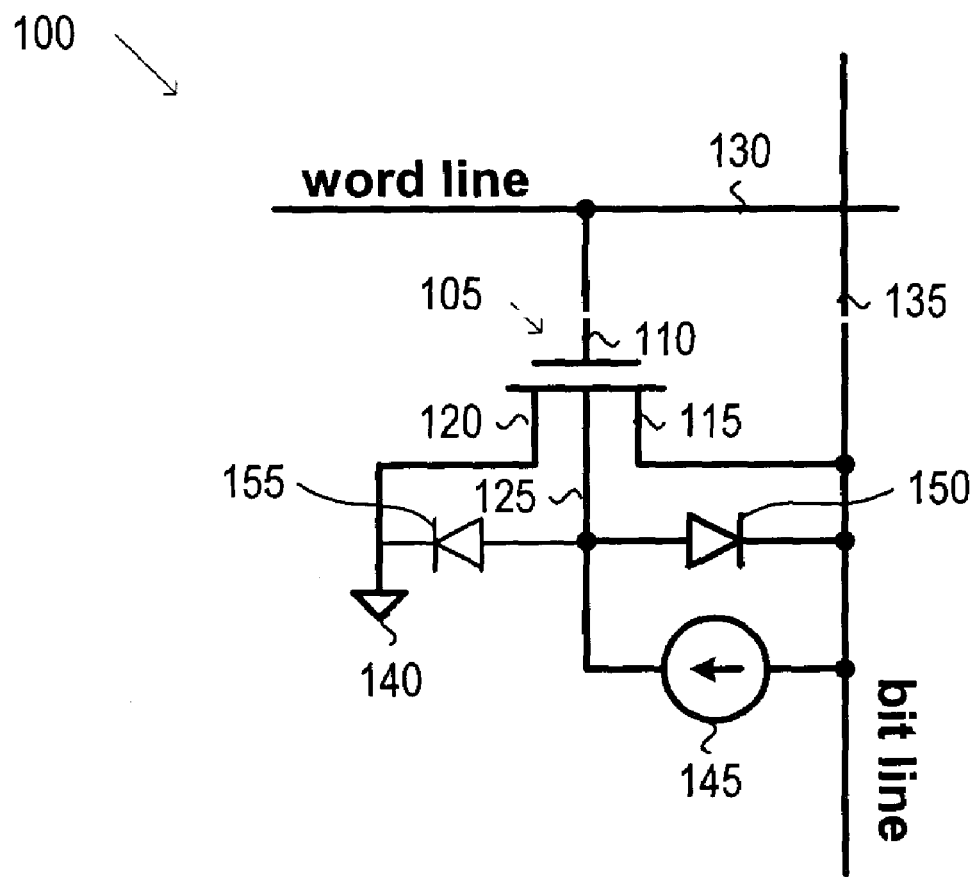
FIG. 1 illustrates an example floating body memory cell, according to one embodiment.

FIG. 1 illustrates an example embodiment of a floating body memory cell 100. The memory cell 100 includes a transistor 105 connected between a word line 130 and a bit line 135. The transistor 105 has a gate 110, a drain 115, a source 120 and a floating body 125. The gate 110 is connected to the word line 130, the drain 115 is connected to the bit line 135, and the source 120 is connected to ground 140. The amount of charge on the floating body 125 determines the cell state. The transistor 105 is illustrated as an N-channel MOS device (NMOS) but is not limited thereto as the transistor could be a P-channel MOS device (PMOS) without departing from the scope. For simplicity, all of the examples to follow will use NMOS transistors, and voltage levels and polarities appropriate for NMOS transistors. In other embodiments, the transistors may be a PMOS and the voltage levels may be different and polarities reversed from that discussed herein.

In one embodiment, impact ionization is used to write a "1" to the memory cell 100. The voltage on the word line 130 and the bit line 135 are raised sufficiently above ground 140 to saturate the transistor 105. The impact ionization current (illustrated as current source 145), resulting from the transistor saturation, injects charge carriers into the floating body 125. As the transistor 105 is NMOS the charge carriers injected into the floating body 125 are holes (positive charge carriers).

In another embodiment, Gate Induced Drain Leakage (GIDL) is used to write a "1" to the memory cell 100. The use of GIDL to inject charge into the floating body 125 of the transistor 105 provides improved efficiency over impact ionization current. In this embodiment, a negative voltage is applied to the word line 130 at the same time that a positive voltage is applied to the bit line 135. This causes band-to-band tunneling (electron flow) from the body 125 to the drain 115. This electron flow to the drain 115 is matched by a flow of holes (positive charge carriers) to the floating body 125.

To write a "0" to the memory cell 100 (for either the impact ionization or the GIDL embodiments), the voltage on the bit line 135 is lowered to the point at which the inherent pn-junction (illustrated as diode 150) between the floating body 125 and the drain 115 is forward biased. This causes ejection of the charge stored in the floating body 125 to the drain 115. To "hold" the state of memory cell 100, the bit line 135 is held at or near ground potential (0 volts) and the word line 130 is set to a negative voltage to ensure that the body potential is held at a level that reverse biases the pn-junctions between the floating body 125 and the drain 115 (diode 150) and between the floating body 125 and the source 120 (illustrated as diode 155).

Data in memory cell 100 is read by operating the transistor 105 in its linear region. In this mode of operation, the variation of the current in the drain 115 as a function of the voltage on the gate 110 will depend on the amount of charge stored in the floating body 125 (known as the "body effect"). The charge stored on the floating body 125 can, in this way, be sensed and read. In contrast to the traditional 1T-1C DRAM cell, this type of read function is nondestructive (the read operation does not drain the stored charge).

Figure 2:
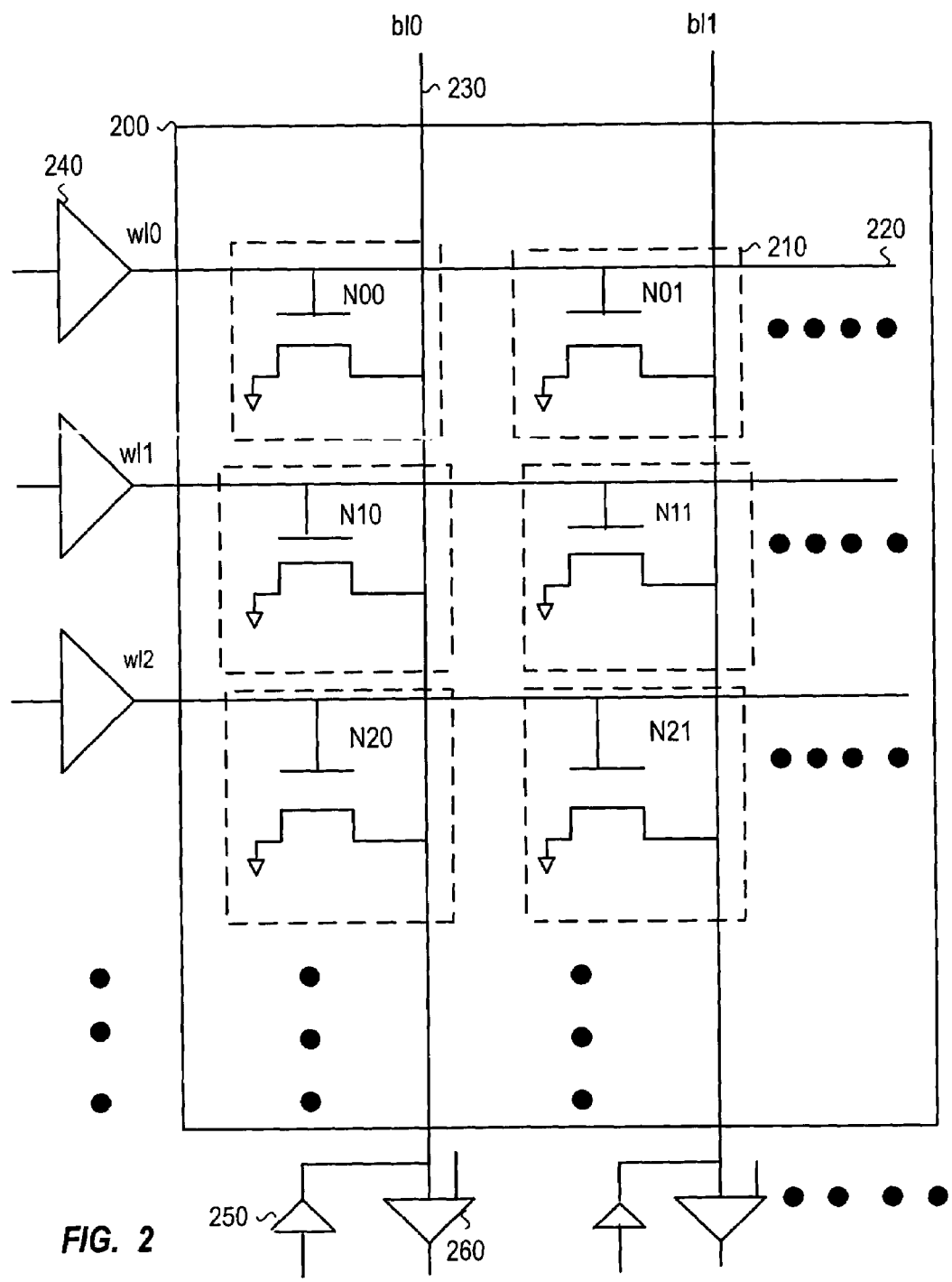
FIG. 2 illustrates an example memory array made up of a plurality of floating body memory cells, according to one embodiment.

FIG. 2 illustrates an example embodiment of a memory array 200. The memory array 200 includes a plurality of memory cells 210 (e.g., 100 of FIG. 1) organized in rows and columns. Each row of memory cells 210 is interconnected by a word line 220 (e.g., 130) and each column of memory cells 210 is interconnected by a bit line 230 (e.g., 135). The memory array 200 illustrated includes 3 word lines (rows) labeled w10–w12, and 2 bit lines (columns) labeled b10–b11 making up 6 memory cells labeled N00–N21. Each word line 220 is driven by a row driver 240 and each bit line 230 is driven by a column driver 250 and read by a sense amplifier 260. A particular row of memory cells 210 is "selected" for a read or write operation by applying an appropriate drive voltage to the word line 220 for the selected row, while leaving all other unselected rows at a voltage level that holds the data. A particular cell (or cells) 210 from the selected row is selected for a write operation by applying an appropriate drive voltage on the bit line (or lines) 230 for the selected cell(s) 210. For example, to select memory cell N01, word line w10 and bit line b11 would be driven. A particular cell (or cells) 210 from the selected row is selected for a read operation by applying an appropriate drive voltage to the word line 220 and reading (sensing) the bit line (or lines) 230 for the selected cell(s) 210. For example, to read memory cell N01, word line w10 would be driven and bit line b11 would be read.

In some embodiments (for example, in bulk silicon implementations, where gate to body coupling is relatively low) cells in unselected rows may suffer severe "disturbs" during write operations. A disturb occurs when a memory cell in an unselected row has charge added to or removed from its transistor body (e.g., 125 of FIG. 1) when the selected cell in the same column is written. For example, if memory cell N10 has a "1" stored, it could be partially discharged when memory cell N00 in the same column is written with a "0". As a result, memory cell N10 storing the partially discharged "1", would lose its state much sooner than if no other cell activity had caused such disturbances. This problem may lead to shorter retention time, and the need for more frequent refresh cycles.

Figure 3A:
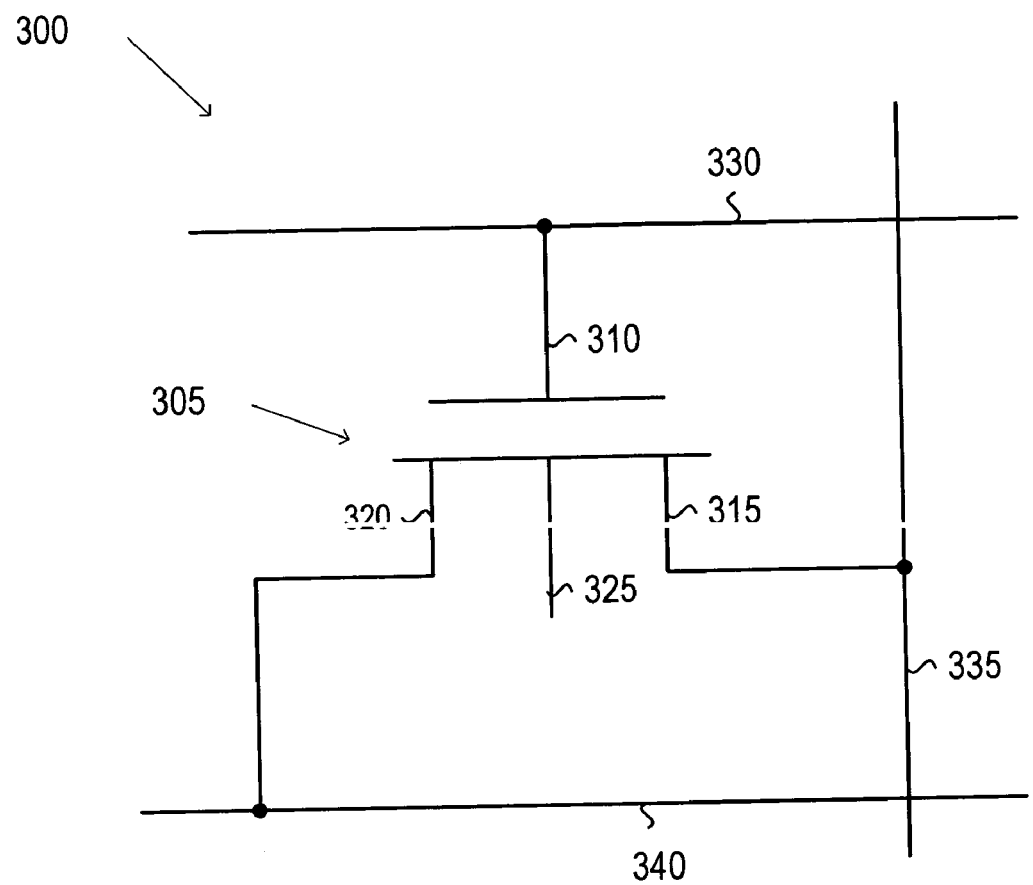
FIGS. 3A–C illustrate example purge-based floating body memory cell, according to one embodiment.

FIG. 3A illustrates an example embodiment of a FBDRAM cell having a purge line (a purge-based floating body memory cell 300). The purge based cell 300 includes a transistor 305 connected between a word line 330, a bit line 335, and a purge line 340. The transistor 305 has a gate 310, a drain 315, a source 320 and a floating body 325. The gate 310 is connected to the word line 330, the drain 315 is connected to the bit line 335, and the source 320 is connected to the purge line 340. The purge line 340 is used to purge the contents in the memory cell 300 prior to a write operation. The contents of the memory cell (whether a "0", a "1", or a charge somewhere in between) may be purged to either a "0" or a "1" and then the new contents can be written thereafter by either maintaining (holding) the purge value or by overwriting the purge value (writing a "1" or a "0"). Data in memory cell 300 is read by operating the transistor 305 in its linear region with the purge line 340 held at or near ground potential.

Figure 3B:
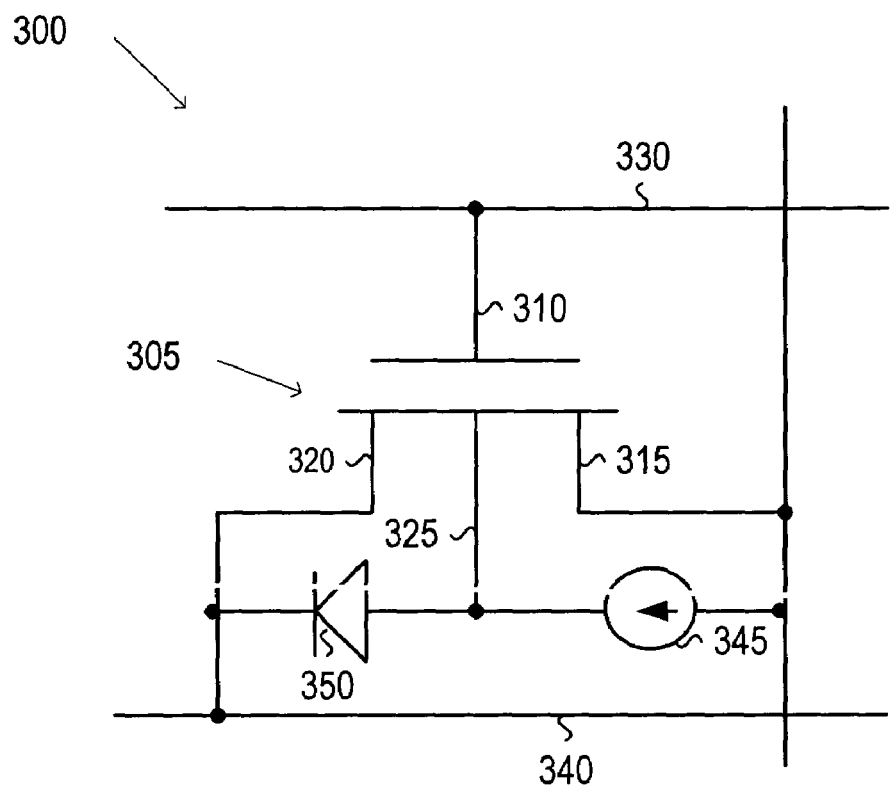

FIG. 3B illustrates an example embodiment of the purge based cell 300 of FIG. 3A utilizing the purge line 340 to write a "0" to the memory cell 300. To write a "0" into the memory cell 300, the word line 330 and the bit line 335 are held at or near ground potential while the purge line 340 is lowered to the point at which the inherent pn-junction (illustrated as diode 350) between the body 325 and the source 320 is forward biased. Holding the "0" may be accomplished by keeping the purge line 340, the word line 330, and the bit line 335 at or near ground potential. To write a "1", the purge line 340 is held at a positive voltage, and a negative voltage is applied to the word line 330 at the same time that a positive voltage, that is more positive than the voltage applied to the purge line 355, is applied to the bit line 335. As in the example above, this causes electron flow to the drain 315 and a matching flow of holes to the floating body 325 through GIDL (illustrated as current source 345). In an alternative embodiment, impact ionization may be used instead of GIDL to charge the floating body 325.

Figure 3C:
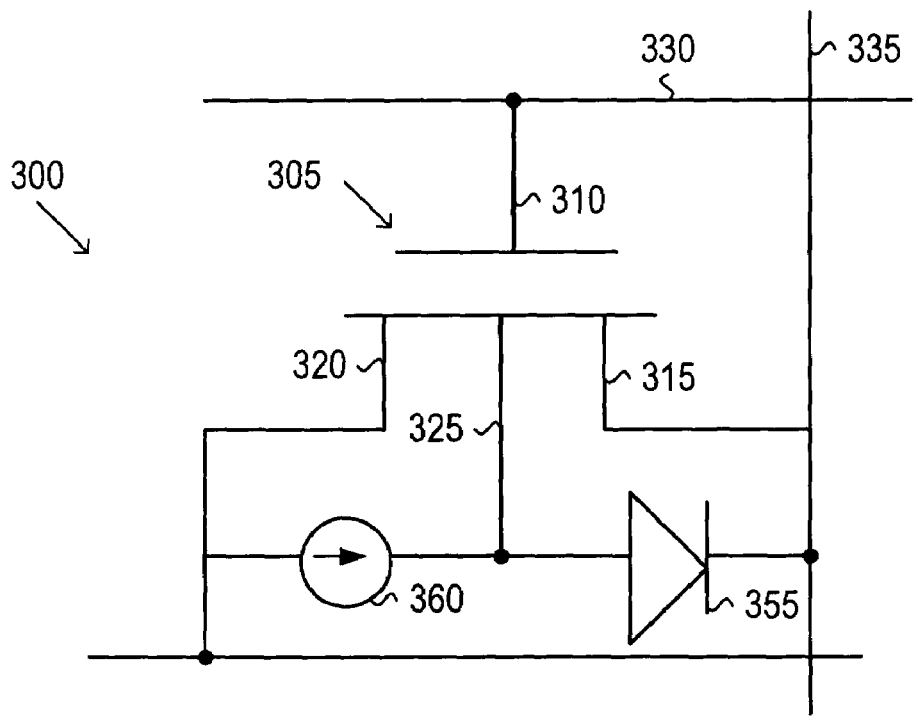

FIG. 3C illustrates an example embodiment of the purge based cell 300 of FIG. 3A utilizing the purge line 340 to write a "1" to the memory cell 300. To write a "1", the bit line 335 is held at or near ground potential, and a positive voltage is applied to the word line 330 at the same time that a more positive voltage, at least Vt higher than the word line voltage, is applied to the purge line 340. This causes the transistor 305 to saturate with a concomitant flow of holes to the floating body 325 through impact ionization (illustrated as current source 360). Holding the "1" may be accomplished by keeping the purge line 340, the word line 330, and the bit line 335 at or below ground potential. To write a "0" into the memory cell 300, the word line 330 and the purge line 340 are held at or near ground potential while the bit line 335 is lowered to the point at which the inherent pn-junction between the floating body 325 and the drain 315 (illustrated as diode 355) is forward biased.

Figure 4:
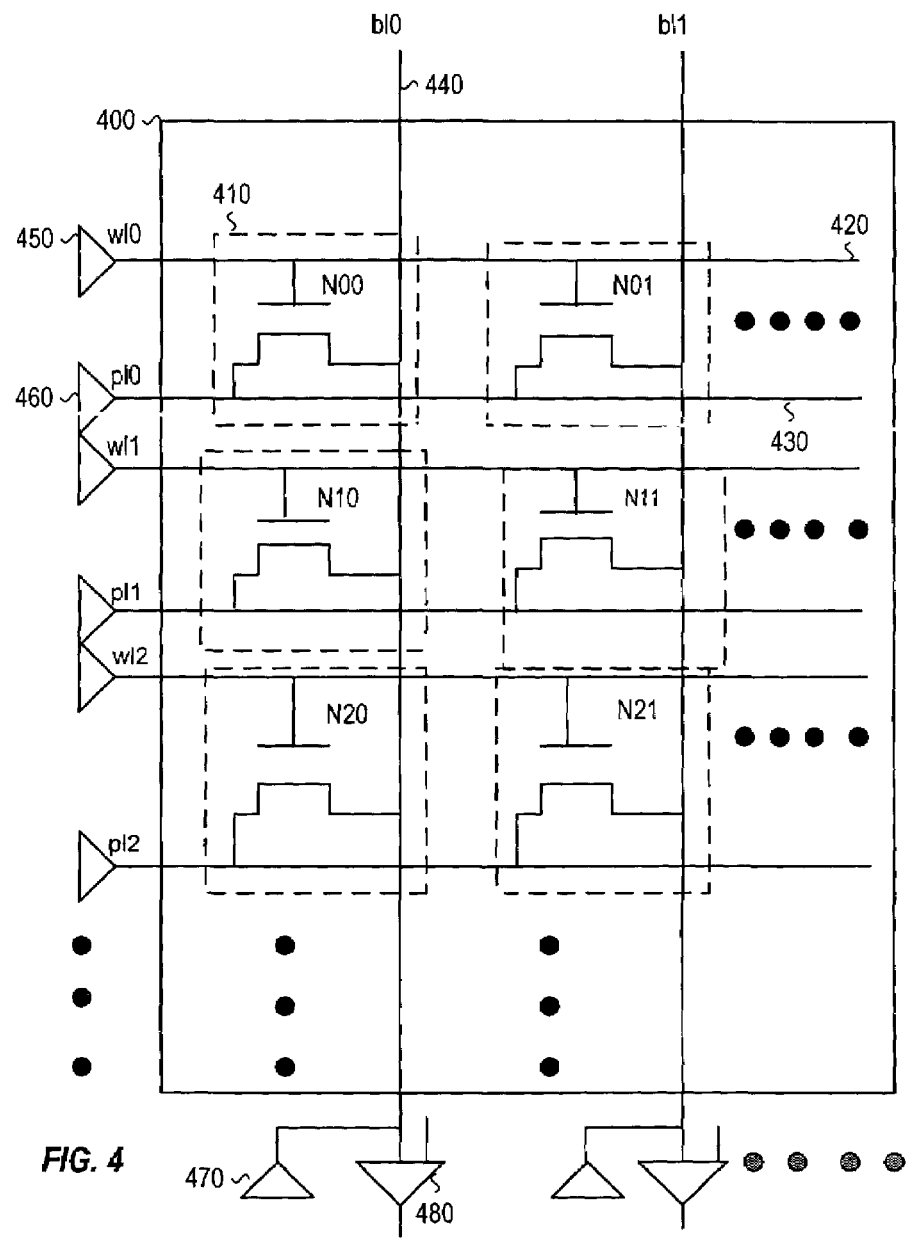
FIG. 4 illustrates an example memory array made up of a plurality of purge-based floating body memory cells, according to one embodiment.

FIG. 4 illustrates an example embodiment of a memory array 400. The memory array 400 includes a plurality of memory cells 410 (e.g., 300 of FIGS. 3A–C) organized in rows and columns. Each row of memory cells 410 is interconnected by a word line 420 (e.g., 330) and a purge line 430 (e.g., 340) and each column of memory cells 410 is interconnected by a bit line 440 (e.g., 335). The memory array 400 illustrated includes 3 rows (3 word lines labeled w10–w12, 3 purge line p10–p12), and 2 columns (2 bit lines labeled b10–b11) making up 6 memory cells labeled N00–N21. Each word line 420 is driven by a row driver 450, each purge line 430 is driven by a purge driver 460, and each bit line 440 is driven by a column driver 470 and read by a sense amplifier 480.

FIG. 5A illustrates a table of example drive levels for each mode of operation of a purge based memory array (e.g., memory array 400 of FIG. 4). The modes of operation covered in the table are to purge a row to "0" 510, to take no action (hold the current values) on a row 520, to write a "1" to a specific memory cell 530, or to keep the purged "0" in a particular memory cell 540. The signals associated with enabling these modes of operation are word lines 550, purge lines 560 and bit lines 570. For a row of memory to be purged to "0" 510, the associated purge line 560 is set to a negative voltage sufficient to forward bias the inherent pn-junctions between the body and drain of all transistors in the first row, while the associated word line 550 and the bit lines 570 remain at or near ground potential ($V_{ss}$). For rows that are not being purged 520, the associated purge lines 560 and word lines 550 as well as the bit lines 570 remain at or near $V_{ss}$. For cells within the selected row that are to have a "1" written 530, the associated purge line 560 will return to at or near $V_{ss}$, the associated word line 550 is set to a negative voltage, and the associated bit line 570 is set to a positive-voltage. For cells within the selected row that are to maintain the "0" 540, the associated purge line 560 will return to at or near $V_{ss}$, the associated word line 550 is set to a negative voltage, and the associated bit line 570 remains at or near $V_{ss}$.

Figure 5B:
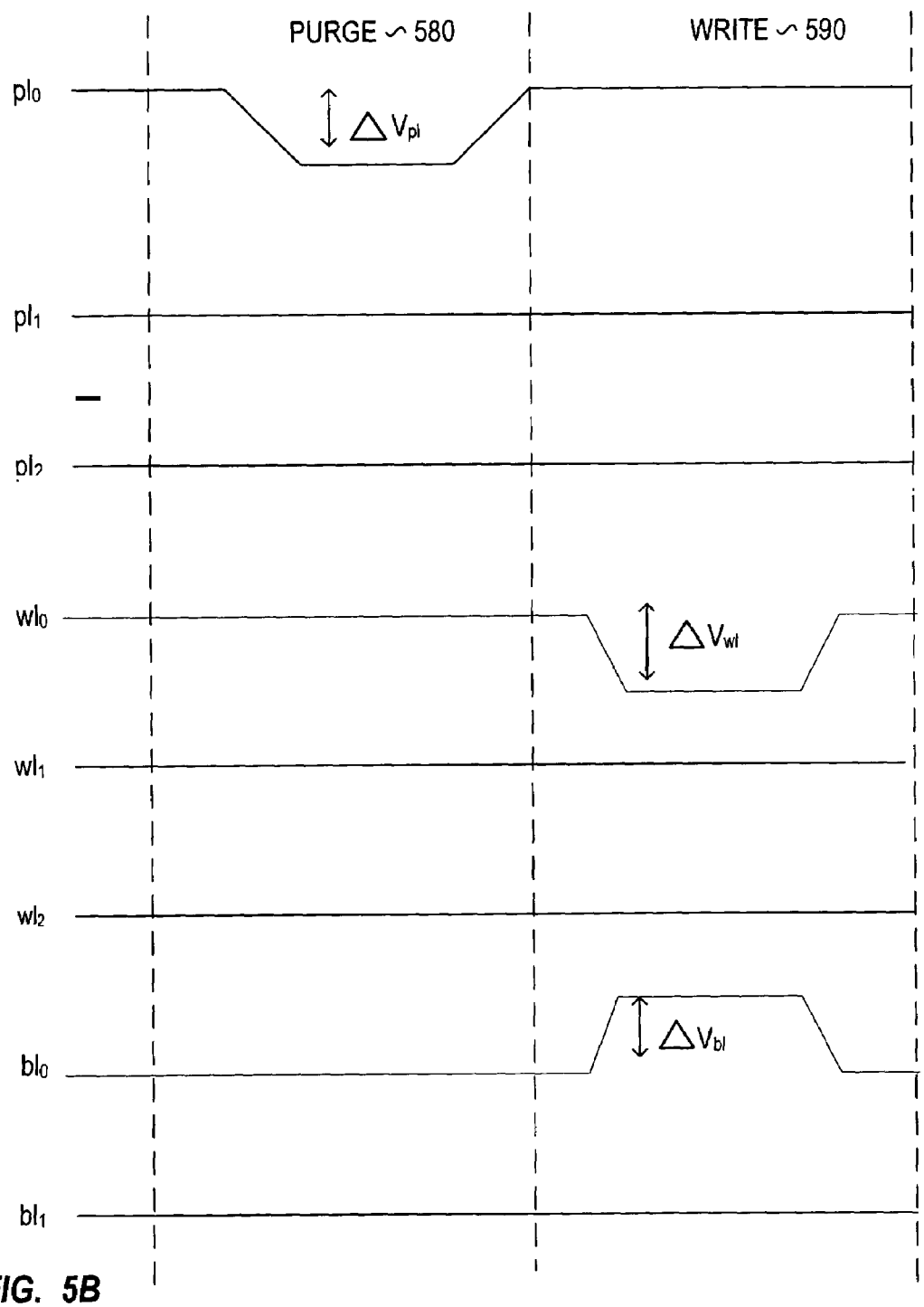
FIG. 5B illustrates an example timing diagram of a two-phase scheme to write data to a purge-based floating body memory array, according to one embodiment.

FIG. 5B illustrates a timing diagram of an example two-phase writing scheme used to write to a memory array (e.g., the memory array 400 of FIG. 4). The two-phase scheme includes a purge phase 580 and a write phase 590. The timing diagram will be discussed with respect to writing a "1" to memory cell N00 of FIG. 4. As memory cell N00 is in the first row, the associated purge line and word line are those associated with the first row (p10 and w10). As memory cell N00 is in the first column, the associated bit line is the bit line associated with the first column (b10). During the purge phase 580, the first purge line (p10) is set to a negative voltage sufficient to forward bias the inherent pn-junctions between the body and drain of all transistors in the first row while all other purge lines (p11–p12) and all word lines and bit lines remain at or near $V_{ss}$. This causes all of the memory cells in the first row (N00, N01) to be set to "0" (e.g., the bodies of all the transistors are discharged).

During the write phase 590, the first purge line (p10) returns to $V_{ss}$ and the first write line (w10) is set to a negative voltage while the first bit line (b10) is set to a positive voltage so that a "1" is written to cell N00. The purge and word lines associated with the second and third rows (p11–2, w11–2) remain at $V_{ss}$. The bit line associated with the second column also remains at or near $V_{ss}$ as cell N01 maintains the "0".

In actual operation, the above two-phase write operation may have been preceded by a row read operation and the data read would be modified as desired and then written during the above-illustrated two-phase write operation. This entire process is known in the art as a "read-modify-write" operation.

In one transistor floating body embodiments, when a "1" is stored in a memory cell (the floating body region is charged), charge will leak from the floating body region due to reverse bias leakage of the inherent drain-body pn-junction.

Figure 6:
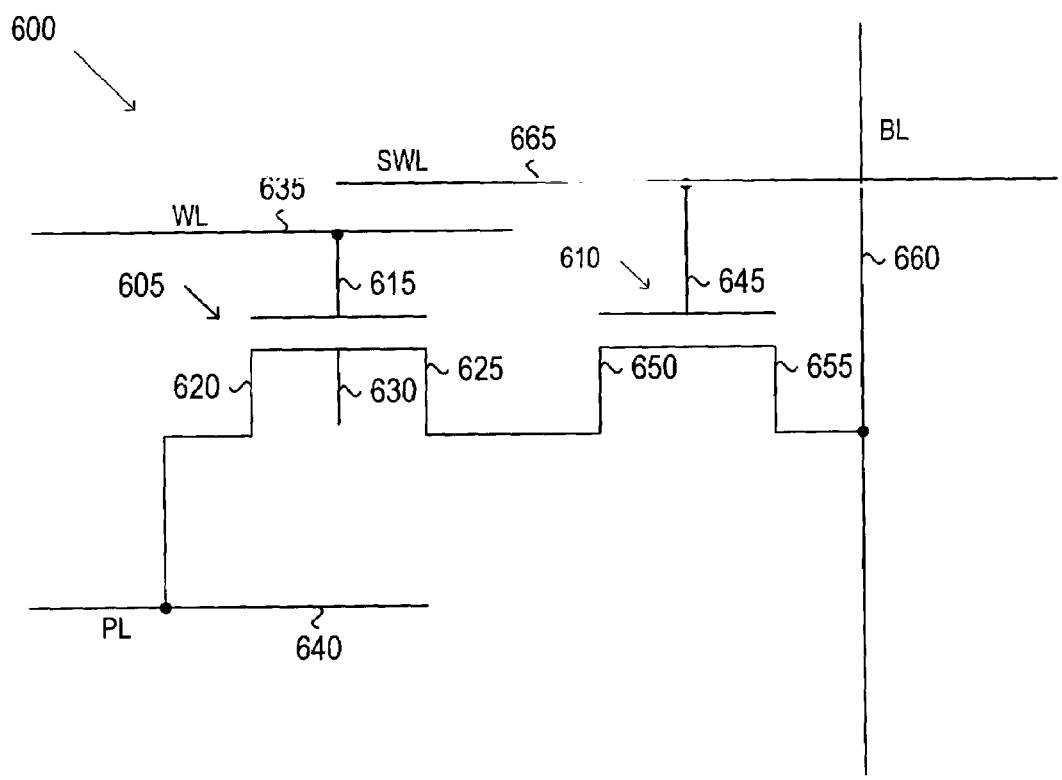
FIG. 6 illustrates an example two transistor purge-based floating body memory cell, according to one embodiment.

FIG. 6 illustrates an example embodiment of a purge-based floating body memory cell 600. The memory cell 600 utilizes two transistors to eliminate charge leakage and improve charge retention time. The memory cell 600 includes a storage transistor 605 and an access transistor 610. The storage transistor 605 has a gate 615, a source 620, a drain 625 and a floating body 630. The storage transistor 605 is connected between a word line 635, a purge line 640 and the access transistor 610, with the gate 615 connected to the word line 635, the source 620 connected to the purge line 640, and the drain 625 connected to the access transistor 610. The access transistor 610 has a gate 645, a source 650 and a drain 655. The access transistor 610 is connected between a second word line 665, a bit line 660 and the storage transistor 605, with the gate 645 connected to the second word line 665, the source 620 connected to the drain 625 of the storage transistor 605, and the drain 625 connected to the bit line 660.

The storage transistor 605 and the access transistor 610 are illustrated as NMOS devices and all of the examples to follow use voltage levels and polarities appropriate for NMOS transistors. However, the scope is not limited to NMOS transistors. In other embodiments, either or both transistors may be PMOS devices and accordingly the voltage levels may be different and some polarities may be reversed from that discussed herein.

Figure 7:
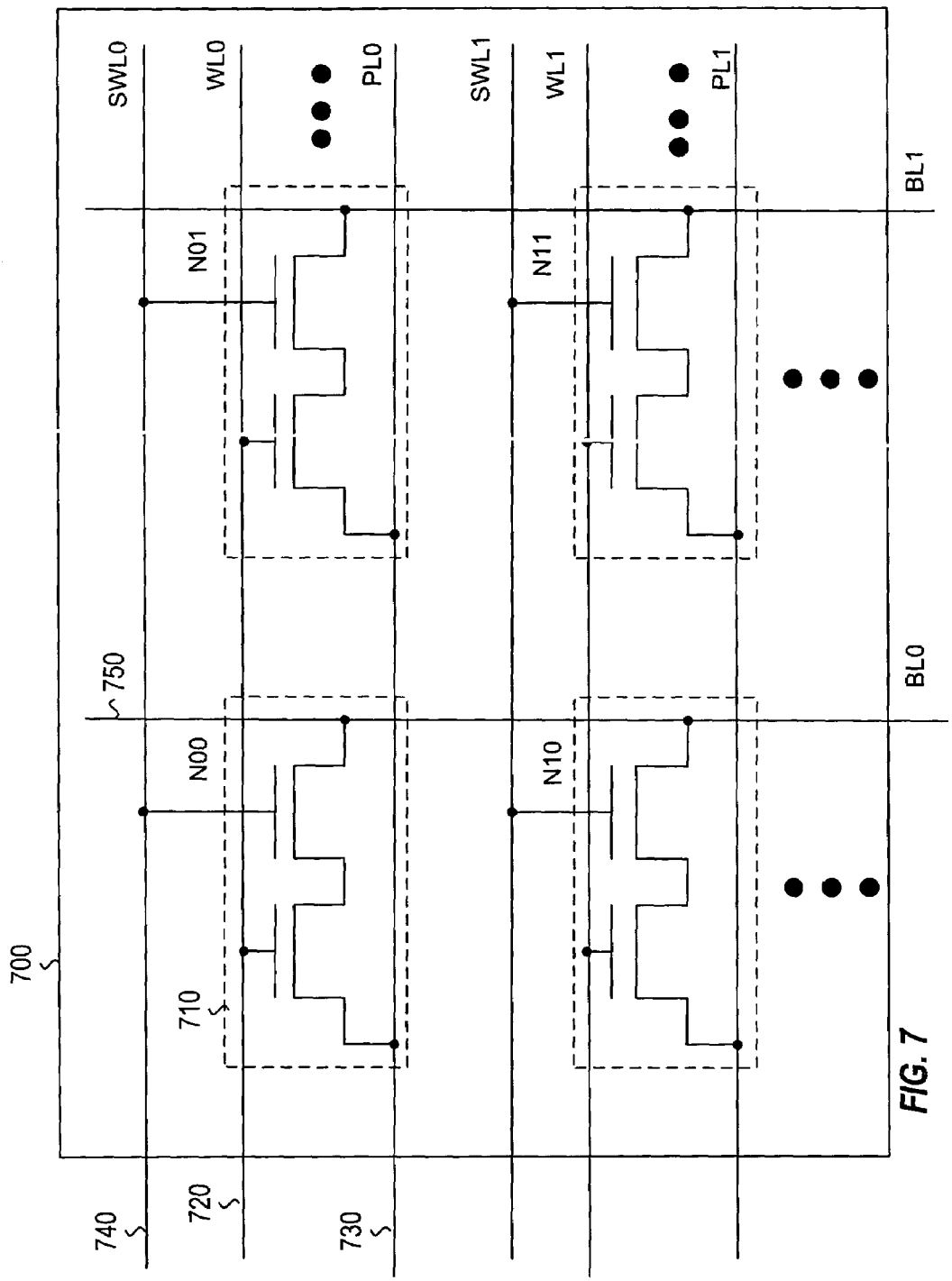
FIG. 7 illustrates an example memory array made up of a plurality of two transistor purge-based floating body memory cells, according to one embodiment.

FIG. 7 illustrates an example embodiment of a memory array 700. The memory array 700 includes a plurality of memory cells 710 (e.g., two transistor purge-based floating body memory cells 600 of FIG. 6) organized in rows and columns. Each row of memory cells 710 is interconnected by a word line 720 (e.g., 635), a purge line 730 (e.g., 640), and a second word line 740 (e.g., 665); and each column of memory cells 710 is interconnected by a bit line 750 (e.g., 660). The memory array 700 illustrated includes 2 rows (2 word lines labeled w10–w11, 2 purge line p10–p11, and 2 second word lines labeled sw10–sw11), and 2 columns (2 bit lines labeled b10–b11) making up 4 memory cells labeled N00–N11.

FIG. 8A illustrates a table of example drive levels for each mode of operation of a purge based memory array (e.g., memory array 700 of FIG. 7). The modes of operation covered in the table are to purge (or write) a row to "1" 800, to take no action (hold the current values) on a row 810, to write a "0" to a specific memory cell 820, or to keep the purged "1" in a particular memory cell 830. The signals associated with enabling these modes of operation are word lines 840, second word lines 850, purge lines 860 and bit lines 870.

For a row of memory to be purged to "1" 800, the purge line 860, the write line 840, and second write line 850 for the associated row are all set to a positive voltage. The bit lines 870 are held at or near $V_{ss}$. This causes all of the memory cells in the row to be set to "1" (e.g., the bodies of all storage transistors are charged by the impact ionization current). For rows that are not being purged (hold) 810, the associated purge lines 860, write lines 840, and second write line 850 are held at or below $V_{ss}$ and the bit lines 870 are held at or near $V_{ss}$. To write a "0" into one or more memory cells in the selected row 820, the associated purge line 860 and write line 840 are set at or below $V_{ss}$, the associated second write line 850 is set to a positive voltage, and the associated bit line(s) 870 are set to a negative voltage (e.g., approximately −1 volt). To maintain the "1" in one or more memory cells in the selected row 820, the associated purge line 860 and write line 840 are set at or below $V_{ss}$, the associated second write line 850 is set to a positive voltage, and the associated bit line(s) 870 is held at or near $V_{ss}$.

Figure 8B:
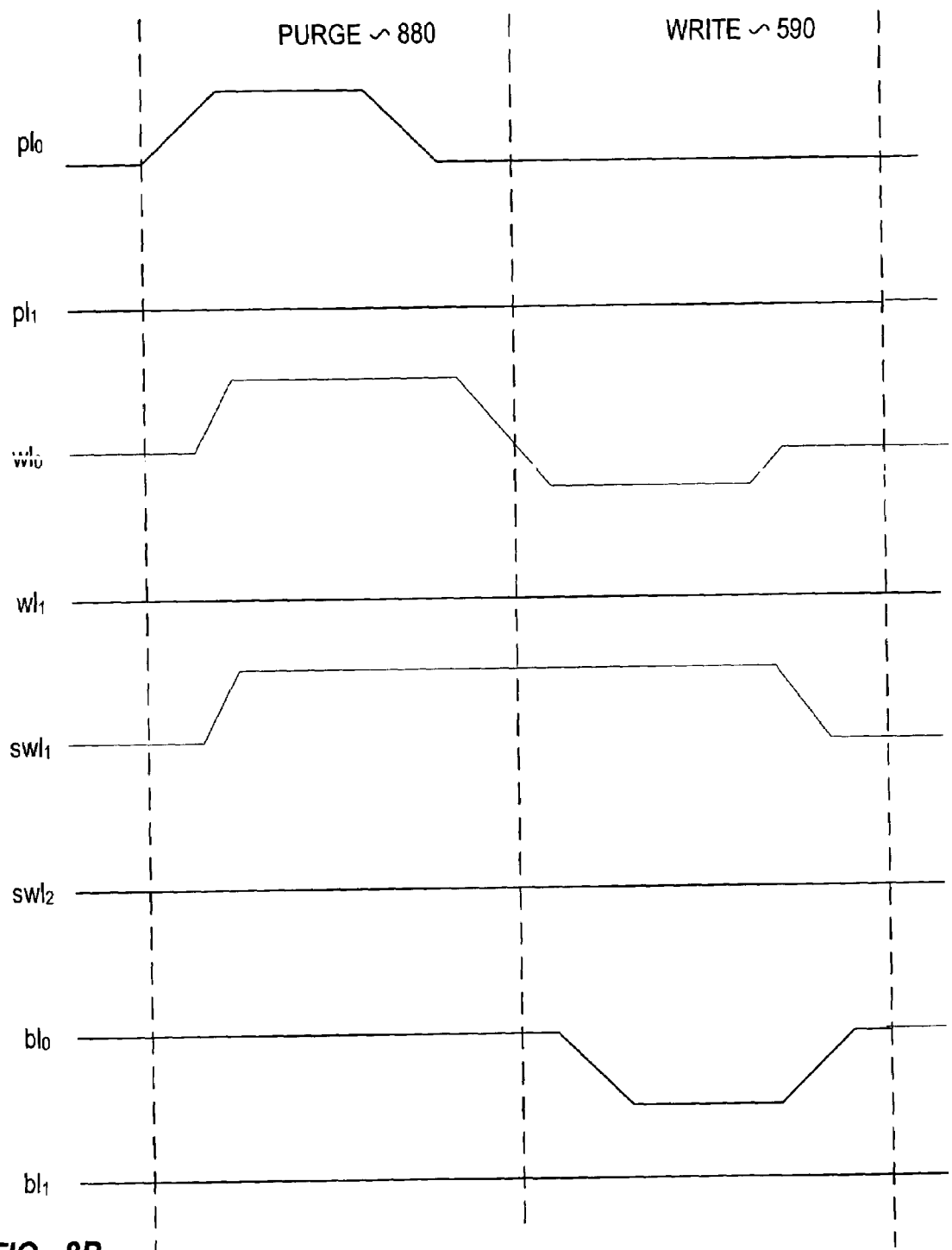
FIG. 8B illustrates an example timing diagram of a two-phase scheme to write data to a two transistor purge-based floating body memory array, according to one embodiment.

FIG. 8B illustrates a timing diagram of an example two-phase writing scheme used to write to a memory array (e.g., the memory array 700 of FIG. 7). The two-phase scheme includes a purge phase 880 and a write phase 890. The timing diagram will be discussed with respect to writing a "1" to memory cell N00 of FIG. 7. As memory cell N00 is in the first row, the associated purge line, word line, and second word line are those associated with the first row (p10, w10, sw10). As memory cell N00 is in the first column, the associated bit line is the bit line associated with the first column (b10).

During the purge phase 880, the first purge line (p10), the first word line (w10), and the first second word line (sw10) are set to a positive voltage while the bit lines (b10–1) are maintained at or below $V_{ss}$ causing all of the memory cells in the first row (N00, N01) to be set to "1" as the bodies of all storage transistors are charged by the impact ionization current. The signals (purge, word, second word) associated with the second row are all maintained at or below $V_{ss}$ so as to hold the current values stored in the cells in this row. During the write phase 890, the first purge line (p10) and the first word line (w10) return to a voltage level at or below $V_{ss}$ and the first second write line (sw10) remains high. The first bit line (b10) is set to a negative voltage causing the cell N00 to have a "0" written therein. The second bit line (b11) remains at or near $V_{ss}$ so that the "1" is held in memory cell N01. The purge, word, and second word lines associated with the second row (p11, w11, sw11) remain at or near $V_{ss}$.

In actual operation, the above two-phase write operation may have been preceded by a row read operation and the data read would be modified as desired and then written during the above-illustrated two-phase write operation. This entire process is known in the art as a "read-modify-write" operation.

Figure 9:
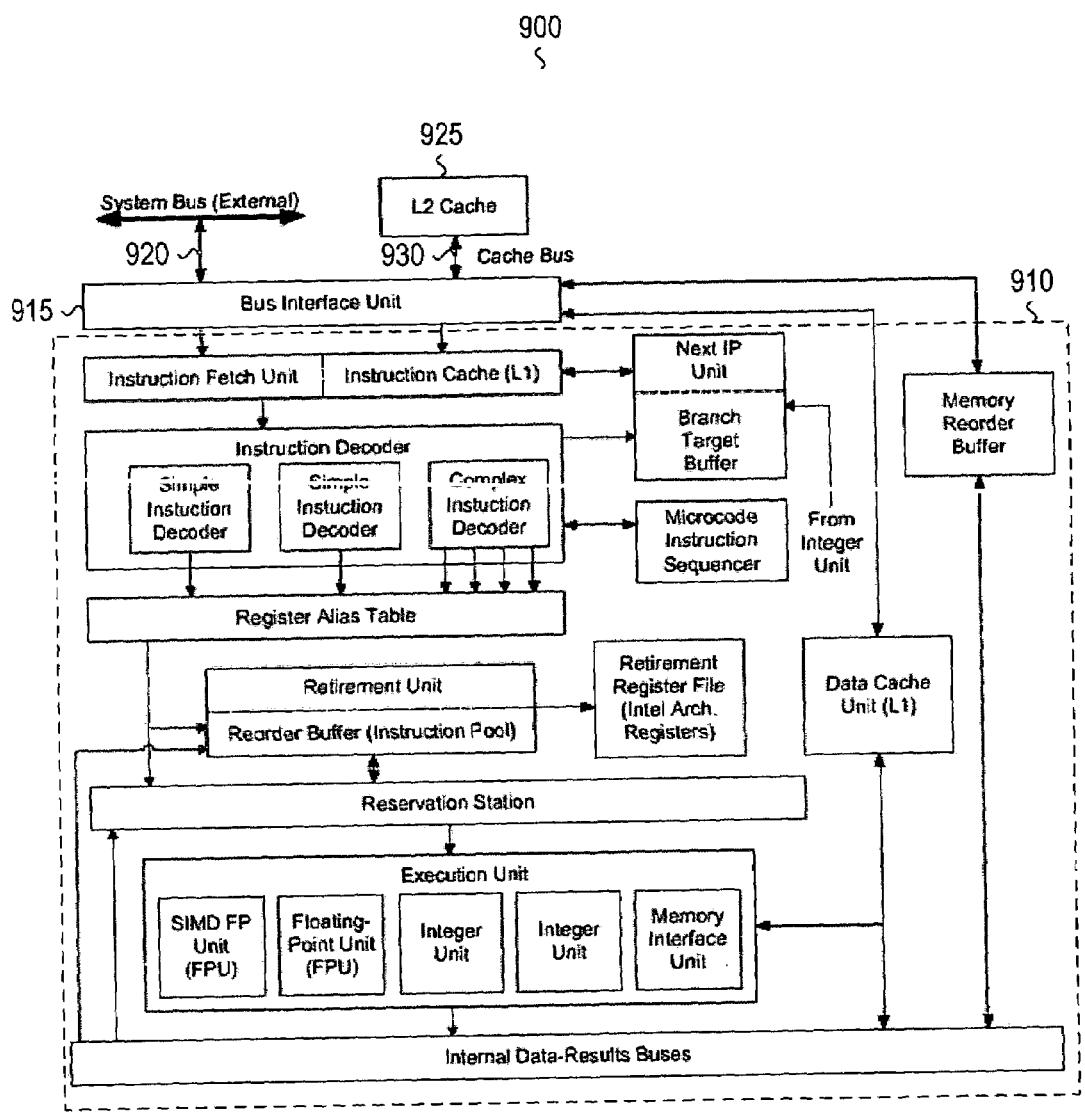
FIG. 9 illustrates an example block diagram of a microprocessor that may use an embodiment of the purge-based floating body memory, according to one embodiment.

FIG. 9 illustrates an example block diagram of a microprocessor that may use an embodiment of the purge-based floating body memory as described herein. Microprocessor 900 comprises core unit 910 that fetches and executes software instructions, bus interface unit 915, system bus 920 that connects core unit 910 to external memory and peripheral devices (not shown) through bus interface unit 915, level 2 cache memory 925, and cache bus 930, which connects core unit 910 to level 2 cache memory 925, also through bus interface unit 915. Level 2 cache memory 925 may be implemented, in one embodiment, as an array of purge-based floating body memory cells along with the necessary support and interface circuitry.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. A memory array comprising:
    a plurality of memory cells arranged in rows and columns, wherein each memory cell includes a transistor having a floating body capable of storing a charge and a second transistor connected to the floating body transistor;
    a plurality of first word lines to provide driving signals to the memory cells, wherein each first word line interconnects to a row of the memory cells;
    a plurality of second word lines to provide driving signals to the memory cells, wherein each second word line interconnects to a row of the second transistors within the memory cells wherein the purge line is activated to iniate a purge;
    a plurality of purge lines to provide driving signals to the memory cells, wherein each purge line interconnects to a row of the memory cells; and
    a plurality of bit lines to provide driving signals to the memory cells, wherein each bit line interconnects to a column of the memory cells, and wherein the driving signals provided on the word lines, the purge lines, and the bit lines can cooperate to alter the charge of the floating body region in one or more of the memory cells.

2. The memory array of claim 1, wherein data is written to a selected memory cell in two phases.

3. The memory array of claim 2, wherein memory cells in a selected row are purged in a first phase and then data is written to selected cells in the selected row in a second phase.

4. The memory array of claim 1, wherein the transistors are N-channel metal-oxide-semiconductor field effect transistors.

5. The memory array of claim 1, wherein the transistors are P-channel metal-oxide-semiconductor field effect transistors.

6. The memory array of claim 1, further comprising driving circuitry to generate the driving signals, wherein the driving circuitry is electrically connected to the first and the second word lines, the purge lines, and the bit lines and transmits the driving signals over appropriate first and second word lines, purge lines, and bit lines.

7. The memory array of claim 6, wherein the driving circuitry includes
    a plurality of column drivers, each colunm driver connected to one of the plurality of bit lines;
    a plurality of first row drivers, each first row driver connected to one of the plurality of first word lines;
    a plurality of second row drivers, each second row driver connected to one of the plurality of second word lines; and
    a plurality of purge drivers, each purge driver connected to one of the plurality of purge lines.

8. The memory array of claim 1, wherein the driving signals are used to increase the charge on the floating body region of the one or more memory cells.

9. The memory array of claim 8, wherein the driving signals utilize impact ionization to increase the charge.

10. The memory array of claim 8, wherein the driving signals utilize gate-induced drain leakage to increase the charge.

11. The memory array of claim 1, wherein the driving signals are used to decrease the charge on the floating body region of the one or more memory cells.

12. The memory array of claim 1, further comprising:
    a plurality of sense amplifiers, each sense amplifier connected to one of the plurality of bit lines, wherein each of the plurality of sense amplifiers is capable of sensing a drain current of at least one memory cell, wherein the drain current is a function of body charge in the floating body region.

13. The memory array of claim 1, wherein the floating body transistor in each memory cell includes a gate connected to an applicable word line, a first terminal connected to an applicable purge line, and a second terminal connected to a first terminal of the second transistor, and the second transistor includes a gate connected to an applicable second word line, and a second terminal connected to an applicable bit line.

14. A method of driving an array of floating body memory cells comprising:
asserting, during a first time period, at least one signal associated with a row of the array to write a "0" to all memory cells in the row of the array; and
asserting, during a second time period, at least one signal associated with the row of the array and at least one signal associated with at least one column of the array to write a data pattern into a row of the array, wherein said asserting during a second time period includes
applying a negative voltage signal via a word line to a gate of an NMOS transistor in each memory cell in the associated row;
applying a ground signal via a bit line to a drain of the NMOS transistor in each memory cell in the associated row maintaining the "0"; and
applying a positive voltage signal via a bit line to the drain of the NMOS transistor in each memory cell in the associated row writing a "1".

15. The method of claim 14, wherein said asserting during a first time period includes applying a negative voltage signal via a purge line to a source of an NMOS transistor in each memory cell in the associated row.

16. The method of claim 14, wherein the data pattern is a sequence of data bits.

17. A method of driving an array of floating body memory cells comprising:
asserting, during a first time period, at least one signal associated with a row of the array to write a "0" to all memory cells in the row of the array; and
asserting, during a second time period, at least one signal associated with the row of the array and at least one signal associated with at least one column of the array to write a data pattern into a row of the array, wherein said asserting during a second time period includes
applying a positive voltage signal via a word line to a gate of a PMOS transistor in each memory cell in the associated row;
applying a ground signal via a bit line to a drain of the PMOS transistor in each memory cell in the associated row maintaining the "0"; and
applying a negative voltage signal via a bit line to a drain of the PMOS transistor in each memory cell in the associated row writing a "1".

18. The method of claim 17, wherein said asserting during a first time period includes applying a positive voltage signal via a purge line to a source of a PMOS transistor in each memory cell in the associated row.

19. A method of driving an array of floating body memory cells comprising:
asserting, during a first time period, at least one signal associated with a row of the array to write a "1" to all memory cells in the row of the array, wherein said asserting during a first time period includes
applying a positive voltage signal via a word line to a gate of a NMOS floating body transistor in each memory cell in the associated row;
applying a positive voltage signal via a second word line to a gate of an NMOS access transistor in each memory cell in the associated row; and
applying a positive voltage signal via a purge line to a source of the NMOS floating body transistor in each memory cell in the associated row; and
asserting, during a second time period, at least one signal associated with the row of the array and at least one signal associated with at least one column of the array to write a data pattern into a row of the array.

20. A method of driving an array of floating body memory cells comprising:
asserting, during a first time period, at least one signal associated with a row of the array to write a "1" to all memory cells in the row of the array; and
asserting, during a second time period, at least one signal associated with the row of the array and at least one signal associated with at least one column of the array to write a data pattern into a row of the array, wherein said asserting during a second time period includes
applying a negative voltage signal via a word line to a gate of a NMOS floating body transistor in each memory cell in the associated row;
applying a positive voltage signal via a second word line to a gate of an NMOS access transistor in each memory cell in the associated row; and
applying a negative voltage signal via a bit line to a drain of the NMOS access transistor in each memory cell in the associated row writing a "0".

21. A computer comprising:
an off die memory device; and
a processor die including a memory array, wherein the memory array includes
a plurality of purge based floating body memory cells arranged in rows and columns, wherein each memory cell is capable of storing a charge on a floating body, wherein the charge stored on the floating body can be altered by applying different combinations of driving signals to the memory cells via different lines interconnected to the memory cells, and wherein each memory cell includes
a first field effect transistor, the first field effect transistor comprising a first terminal, a second terminal, a gate, and the floating body region; and
a second field effect transistor, the second field effect transistor comprising a first terminal, a second terminal, and a gate, wherein the first terminal of the second field effect transistor is interconnected to the second terminal of the first field effect transistor:
a plurality of word lines, each word line interconnecting the gates of the first field effect transistor within the memory cells of a single row;
a plurality of purge lines, each purge line interconnecting the first terminals of the first field effect transistor within the memory cells of a single row wherein the purge line is activated to initiate a purge;
a plurality of second word lines, each second word line interconnecting the gates of the second field effect transistor within the memory cells of a single row;
a plurality of bit lines, each bit line interconnecting the second terminals of the second field effect transistor within the memory cells of a single row; and
driving circuitry electrically connected to the word lines, purge lines, second word lines, and bit lines, wherein the driving circuitry, the word lines, the purge lines, the second word lines, and the bit lines can cooperate to alter the charge of the floating body region in one or more memory cells.

* * * * *